United States Patent
Chang et al.

(10) Patent No.: US 12,218,230 B2
(45) Date of Patent: Feb. 4, 2025

(54) P-GAN HIGH-ELECTRON-MOBILITY TRANSISTOR

(71) Applicant: NATIONAL SUN YAT-SEN UNIVERSITY, Kaohsiung (TW)

(72) Inventors: Ting-Chang Chang, Kaohsiung (TW); Mao-Chou Tai, Kaohsiung (TW); Yu-Xuan Wang, Kaohsiung (TW); Wei-Chen Huang, Kaohsiung (TW); Ting-Tzu Kuo, Kaohsiung (TW); Kai-Chun Chang, Kaohsiung (TW); Shih-Kai Lin, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 456 days.

(21) Appl. No.: 17/868,104

(22) Filed: Jul. 19, 2022

(65) Prior Publication Data
US 2023/0378337 A1    Nov. 23, 2023

(30) Foreign Application Priority Data
May 17, 2022   (TW) .................................. 111118402

(51) Int. Cl.
*H01L 21/00*    (2006.01)
*H01L 29/20*    (2006.01)
*H01L 29/778*   (2006.01)

(52) U.S. Cl.
CPC ...... *H01L 29/7785* (2013.01); *H01L 29/2003* (2013.01)

(58) Field of Classification Search
CPC ............. H01L 29/7785; H01L 29/2003; H01L 29/41766
See application file for complete search history.

(56) References Cited

U.S. PATENT DOCUMENTS

| | | | |
|---|---|---|---|
| 8,895,993 B2* | 11/2014 | Kalnitsky | H01L 29/66143 257/77 |
| 9,236,464 B2* | 1/2016 | Chiang | H01L 29/7787 |
| 9,343,542 B2 | 5/2016 | Kalnitsky et al. | |
| 9,685,545 B2* | 6/2017 | Tipirneni | H01L 29/0619 |
| 10,224,401 B2* | 3/2019 | Mishra | H01L 29/4236 |
| 10,243,057 B2* | 3/2019 | Shi | H01L 29/7786 |
| 11,289,592 B2* | 3/2022 | Chang | H01L 23/291 |
| 12,051,742 B1* | 7/2024 | Zhang | H01L 29/2003 |

(Continued)

FOREIGN PATENT DOCUMENTS

| | | | | |
|---|---|---|---|---|
| CN | 102623490 B | * | 4/2015 | ......... H01L 21/0254 |
| CN | 106328700 B | * | 3/2019 | ......... H01L 29/0603 |

(Continued)

*Primary Examiner* — Laura M Menz
(74) *Attorney, Agent, or Firm* — WPAT, PC

(57) ABSTRACT

A p-GaN high-electron-mobility transistor, includes a substrate, a channel layer stacked on the substrate, a supply layer stacked on the channel layer, a first doped layer stacked on the supply layer, a second doped layer stacked on the first doped layer, and a third doped layer stacked on the second doped layer. A doping concentration of the first doped layer and the doping concentration of the third doped layer are lower than a doping concentration of the second doped layer. A gate is located on the third doped layer, and a source and a drain are electrically connected to the channel layer and the supply layer, respectively.

4 Claims, 2 Drawing Sheets

(56) References Cited

U.S. PATENT DOCUMENTS

| | | | | |
|---|---|---|---|---|
| 2007/0278521 | A1* | 12/2007 | Ishida | H01L 29/0891 257/E29.253 |
| 2012/0193637 | A1* | 8/2012 | Kalnitsky | H01L 29/42316 257/E21.451 |
| 2013/0146890 | A1* | 6/2013 | Hwang | H01L 29/7787 257/195 |
| 2014/0077267 | A1* | 3/2014 | Heo | H01L 29/66431 257/194 |
| 2015/0034972 | A1* | 2/2015 | Kuraguchi | H01L 29/7786 257/77 |
| 2015/0087118 | A1* | 3/2015 | Chiang | H01L 29/66462 438/172 |
| 2017/0092747 | A1* | 3/2017 | Nakata | H01L 21/465 |
| 2019/0280112 | A1* | 9/2019 | Shimizu | H01L 21/2233 |
| 2019/0334023 | A1* | 10/2019 | Nakata | H01L 29/2003 |
| 2020/0161461 | A1* | 5/2020 | Lee | H01L 29/0603 |
| 2021/0367068 | A1* | 11/2021 | Chang | H01L 29/7786 |
| 2022/0123136 | A1* | 4/2022 | Chang | H01L 29/2003 |
| 2022/0130988 | A1* | 4/2022 | Fareed | H01L 29/7786 |
| 2022/0157978 | A1* | 5/2022 | Chang | H01L 29/7786 |
| 2022/0310833 | A1* | 9/2022 | Shin | H01L 29/205 |
| 2022/0334167 | A1* | 10/2022 | Chang | G01R 31/2621 |
| 2023/0197840 | A1* | 6/2023 | Bajaj | H01L 29/1066 257/76 |
| 2023/0378337 | A1* | 11/2023 | Chang | H01L 29/7786 |
| 2024/0154021 | A1* | 5/2024 | Chang | H01L 23/291 |
| 2024/0266430 | A1* | 8/2024 | Zhang | H01L 29/66431 |
| 2024/0387163 | A1* | 11/2024 | Chang | H01L 21/02057 |

FOREIGN PATENT DOCUMENTS

| | | | | |
|---|---|---|---|---|
| CN | 113972204 | A * | 1/2022 | H01L 27/088 |
| TW | 202145577 | A * | 12/2001 | H01L 29/7786 |
| WO | WO-2013010829 | A1 * | 1/2013 | H01L 29/66431 |
| WO | WO-2023236523 | A1 * | 12/2023 | H01L 27/085 |

\* cited by examiner

P-GAN HIGH-ELECTRON-MOBILITY TRANSISTOR

CROSS REFERENCE TO RELATED APPLICATION

The application claims the benefit of Taiwan application serial No. 111118402, filed on May 17, 2022, and the entire contents of which are incorporated herein by reference.

BACKGROUND OF THE INVENTION

1. Field of the Invention

The present invention relates to an electronic device and, more particularly, to a p-GaN high-electron-mobility transistor (HEMT) that can reduce gate leakage.

2. Description of the Related Art

In response to the rapid development of technologies such as electric cars, base stations, and radio frequency communication, the new generation of semiconductor devices needs to meet the requirements of high-power conversion, high-rate transmission, high bandwidth and low energy consumption. GaN has the characteristics of wide band gap, high breakdown voltage, high electron saturation velocity and good thermostability, and is accordingly an ideal semiconductor material. A high-electron-mobility transistor (HEMT) with GaN as the main material is a depletion-mode component that is conducted when no gate bias is applied, which poses a risk to safety in circuit application. Therefore, the GaN layer is doped in the conventional GaN-based HEMT to form a p-GaN layer, thus making the HEMT become an enhanced-mode element that capable of switching on or off by driving a gate.

In order to effectively increase the energy band for enhancement, the conventional p-GaN HEMT will be highly doped to form a $p^+$-GaN layer. However, in testing of reliability of the $p^+$-GaN HEMT such as high temperature gate bias (HTGB) test and high temperature reverse bias (HTRB) test, as a result of an ohmic contact of the metal gate to the highly doped $p^+$-GaN layer, hole tunneling occurs at the metal-semiconductor interface, resulting in severe leakage current. In addition, due to the reverse bias, an extremely thin depletion region is formed between the highly doped $p^+$-GaN layer and the AlGaN layer, causing direct tunneling of electrons, forming leakage current. Both of the foregoing tunnelings will cause the failure of transistor components.

In light of the above, it is necessary to improve the conventional p-GaN HEMT.

SUMMARY OF THE INVENTION

To resolve the foregoing problem, it is an objective of the present invention to provide a p-GaN HEMT that is able to suppress leakage current inside the transistor during operation.

It is another objective of the present invention to provide a p-GaN HEMT that is able to avoid the transistor from dropping in inception voltage which otherwise results in deterioration.

It is yet another objective of the present invention to provide a p-GaN HEMT that can reduce process difficulty and production costs.

As used herein, the term "a" or "an" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

A p-GaN high-electron-mobility transistor of the present invention includes a substrate, a channel layer stacked on the substrate, a supply layer stacked on the channel layer, a first doped layer stacked on the supply layer, a second doped layer stacked on the first doped layer, and a third doped layer stacked on the second doped layer. A doping concentration of the first doped layer and a doping concentration of the third doped layer are lower than a doping concentration of the second doped layer. A gate is located on the third doped layer. A source and a drain are electrically connected to the channel layer and the supply layer respectively.

Thus, in the p-GaN HEMT of the present invention, semiconductor layers with low doping concentrations are respectively formed above and below a highly doped semiconductor layer, which can prevent a metal gate and an electron supply layer from directly contacting the highly doped semiconductor layer to form an ohmic contact at the gate interface and widen the depletion region at the interface. Thus, the effects of stabilizing the inception voltage of the transistor, suppressing the tunneling current, and consequently improving the performance and reliability of the transistor component can be achieved. In addition, the process of controlling the doping concentration does not require a change to the transistor structure, which has the effect of reducing process difficulty and production costs.

In an example, the doping concentration of the first doped layer and the doping concentration of the third doped layer are $1\times10^{16}$ to $1\times10^{18}$ atom/cm$^3$, and the doping concentration of the second doped layer is greater than $1\times10^{18}$ atom/cm$^3$. Thus, by limiting the doping concentrations, the second doped layer can form an enhanced-mode element, and the first doped layer and the third doped layer can suppress leakage, improving the performance and reliability of the element.

In an example, the first doped layer and the third doped layer are a p-GaN layer, and the second doped layer is a $p^+$-GaN layer. Thus, the GaN transistor has high power density and high transmission rate, reducing the size of components to miniaturize electronic products.

In an example, the first doped layer, the second doped layer and the third doped layer are formed by introducing a dopant during a deposition process, with the dopant being any one of alkaline earth metals. Thus, the doping of alkaline earth elements into the semiconductor can improve the electrical performance of the semiconductor devices, improving the performance of the transistor.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
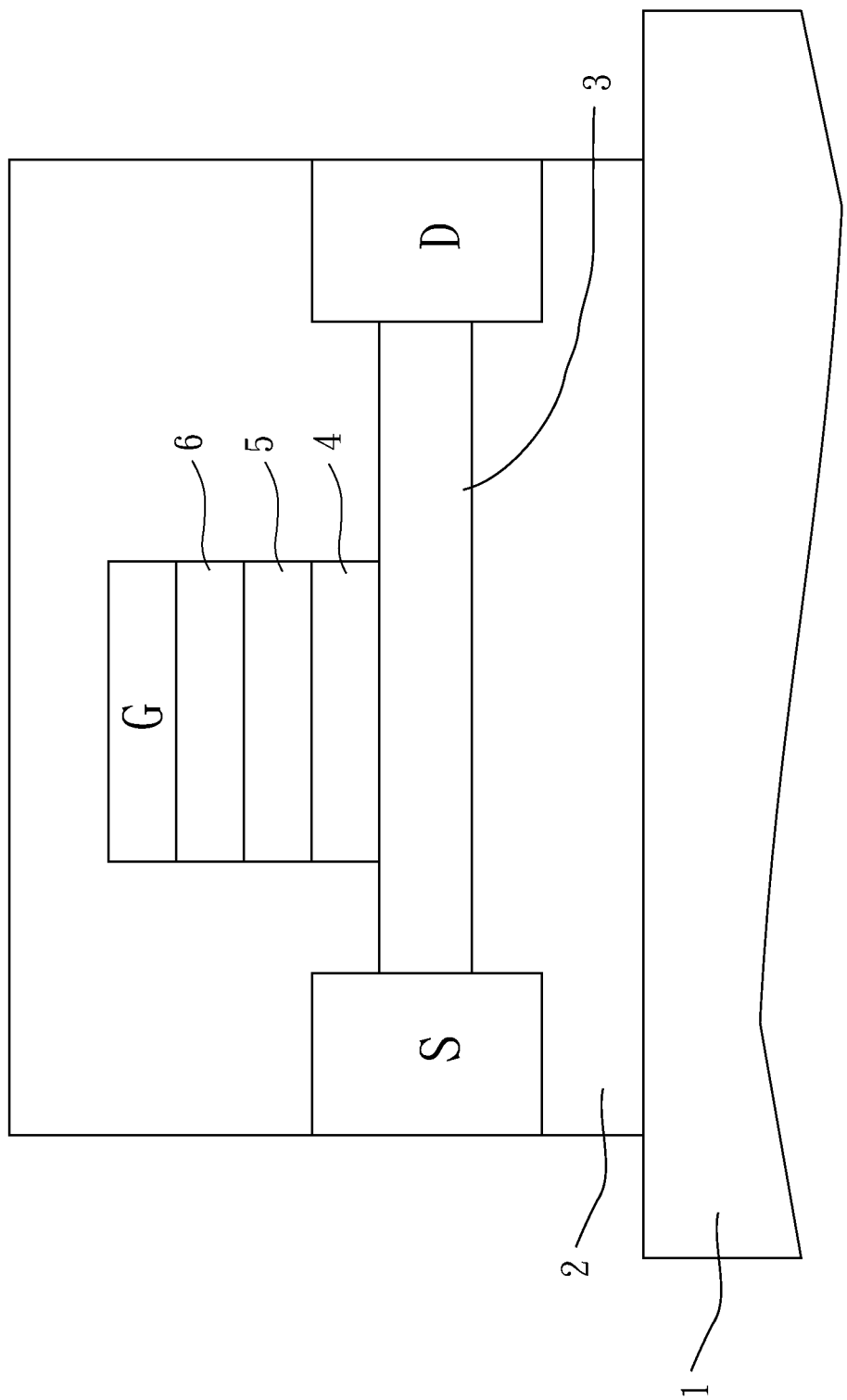
FIG. 1 is a schematic diagram of a stacked structure according to a preferred embodiment of the present invention.

When the terms "front", "rear", "left", "right", "up", "down", "top", "bottom", "inner", "outer", "side", and similar terms are used herein, it should be understood that these terms have reference only to the structure shown in the drawings as it would appear to a person viewing the drawings and are utilized only to facilitate describing the invention, rather than restricting the invention.

DETAILED DESCRIPTION OF THE INVENTION

FIG. 1 shows a preferred embodiment of the p-GaN HEMT of the present invention, which includes a substrate 1, a channel layer 2, a supply layer 3, a first doped layer 4, a second doped layer 5, and a third doped layer 6. The channel layer 2 is located on the substrate 1. The supply layer 3 is located on the channel layer 2. The first doped layer 4, the second doped layer 5, and the third doped layer 6 are sequentially stacked on the supply layer 3 from bottom to top.

The substrate 1 is configured to carry a transistor. Transistor materials such as metals, insulators and semiconductors are formed on the substrate 1, such that the loss of electrons can be reduced, and harmful electrical effects can be prevented. The material of the substrate 1 is preferably silicon.

The channel layer 2 and the supply layer 3 are made of materials with different band gaps. A two-dimensional electron gas (2DEG) is formed at the heterojunction between the channel layer 2 and the supply layer 3, which can provide a channel for electrons to move rapidly, so that the GaN HEMT has good high-frequency characteristics. In this embodiment, the material of the channel layer 2 is GaN, and the material of the supply layer 3 is AlGaN.

The first doped layer 4, the second doped layer 5, and the third doped layer 6 are formed by introducing a dopant into an intrinsic semiconductor during deposition. The amount of the dopant in the semiconductor is referred to as the doping concentration, which is usually expressed in the number of atoms per cubic centimeter (atom/cm$^3$). A doping concentration of the first doped layer 4 at the bottom and a doping concentration of the third doped layer 6 on the top are lower than a doping concentration of the second doped layer 5 in the middle. In this embodiment, the doping concentration of the first doped layer 4 and the doping concentration of the third doped layer 6 are $1\times10^{16}$ to $1\times10^{18}$ atom/cm$^3$, and the doping concentration of the second doped layer 5 is greater than $1\times10^{18}$ atom/cm$^3$. The intrinsic semiconductor may be GaN. The dopant may be any one of alkaline earth (group IIA) metals, namely Be, Mg, Ca, Sr, Ba and Ra. In this case, the first doped layer 4 and the third doped layer 6 are a generally-doped p-GaN layer; and the second doped layer 5 is a highly doped p$^+$-GaN layer, which is regarded as a degenerate semiconductor at room temperature with a high carrier concentration, making its conductivity similar to that of a metal.

In addition, the p-GaN HEMT includes a gate G, a source S and a drain D. The gate G is located on the third doped layer 6. The source S and the drain D are electrically connected to the channel layer 2 and the supply layer 3, respectively, so that electrons between the source S and the drain D efficiently move between the channel layer 2 and the supply layer 3. In addition, the output current of the drain D is adjusted by adjusting the magnitude of the electric field between the gate G and the substrate 1.

A conventional p-GaN HEMT only has a single highly doped p$^+$-GaN layer. When the voltage provided by a gate increases, hole tunneling occurs at the interface between the gate and the highly doped p$^+$-GaN layer, and the holes are directly injected into a lower supply layer, resulting in a decrease in the inception voltage of the transistor component. Thus, the component is conducted when the gate voltage is low or even no voltage is applied. In addition, an extremely thin depletion region is formed between the highly doped p$^+$-GaN layer and the supply layer and consequently causes tunneling of electrons, forming leakage current. In the p-GaN HEMT of the present invention, the second doped layer 5 in the middle forms a highly doped p$^+$-GaN layer, and the first doped layer 4 and the third doped layer 6 respectively located above and below the second doped layer 5 have a low doping concentration, which can prevent the highly doped p$^+$-GaN layer from directly contacting the metal gate G and can increase the width of the depletion region between the first doped layer 4 and the supply layer 3, thereby suppressing tunneling leakage.

In addition, in the manufacturing process of the p-GaN HEMT of the present invention, it is only necessary to control the concentrations of the dopant introduced in the process of deposition of the first doped layer 4, the second doped layer 5 and the third doped layer 6, without additional process requirements such as modifying the photomask and changing the transistor structure being required. Thus, process difficulty and production costs can be reduced.

Figure 2:
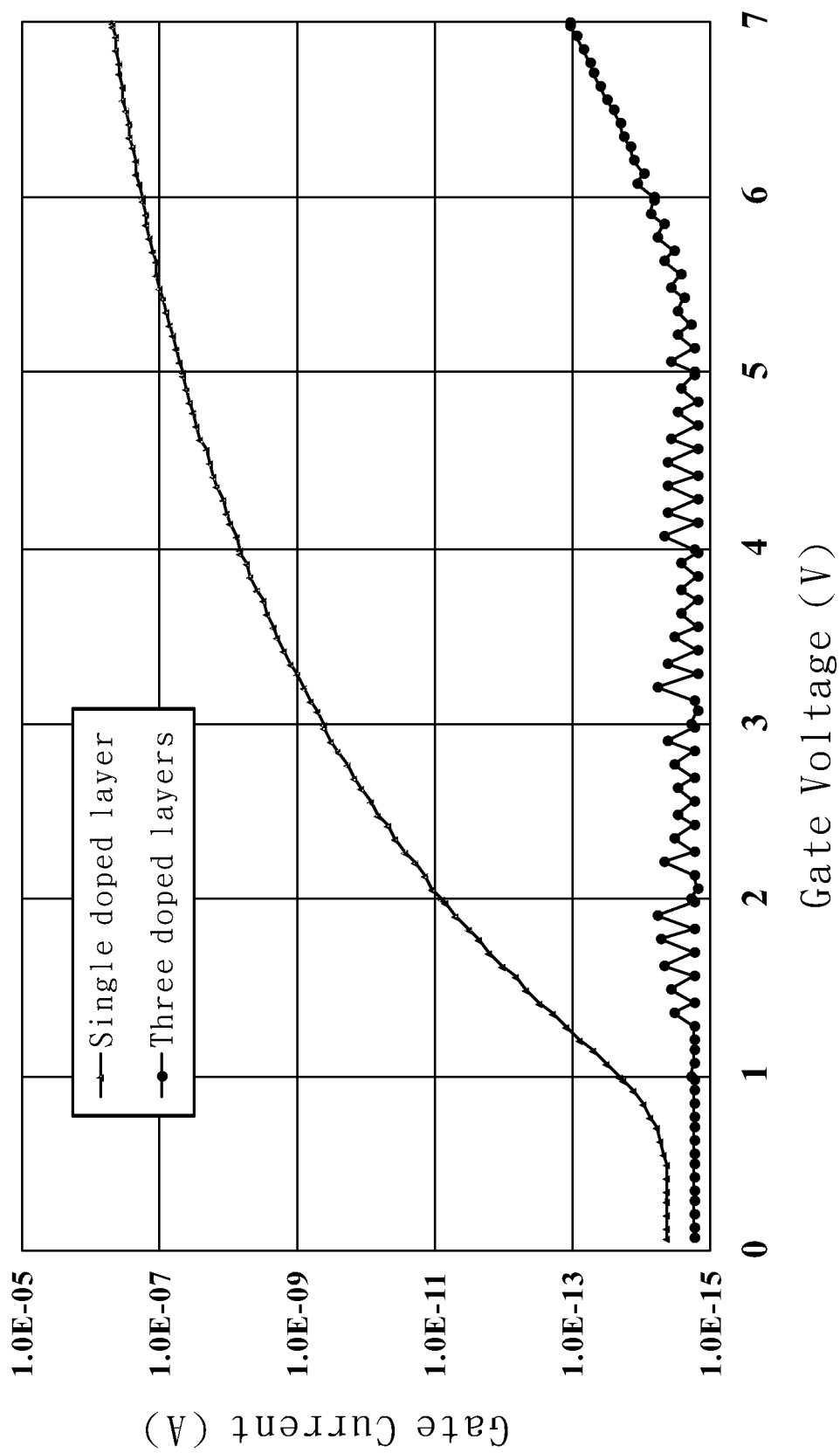
FIG. 2 is a graph showing the relationship between the gate current and gate voltage of transistors in a preferred embodiment of the present invention and in the conventional transistor.

FIG. 2 shows the relationship between the gate current and gate voltage of the p-GaN HEMT with three doped layers of the present invention and the conventional p-GaN HEMT with a single doped layer. It can be seen from changes of the curve that, when the gate voltage increases to 1 volt, the gate current of the structure with the single doped layer starts to increase continuously, indicating that the inception voltage of the transistor component has been reached; while the gate current of the structure with the three doped layers starts to increase when the gate voltage reaches 6 volts. In addition, when the gate voltage is 7 volts, the structure with the single doped layer and the structure with the three doped layers differ in the gate current by at least 6 orders of magnitude ($10^6$). It can be learned from the results of comparison that three doped layers stacked in the order of low-high-low concentration can avoid a decrease in the inception voltage and suppress the gate leakage current.

In view of the foregoing, in the p-GaN HEMT of the present invention, p-GaN layers with low doping concentrations are respectively formed above and below a highly doped p$^+$-GaN layer, which can prevent a metal gate and an electron supply layer from directly contacting the highly doped p$^+$-GaN layer to form an ohmic contact at the gate interface and widen the depletion region at the interface. Thus, the effects of stabilizing the inception voltage of the transistor, suppressing the tunneling current and consequently improving the performance and reliability of the transistor component can be achieved. In addition, the process of controlling the doping concentrations does not require a change to the transistor structure, which has the effect of reducing process difficulty and production costs.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A p-GaN high-electron-mobility transistor, comprising:
   a substrate;
   a channel layer stacked on the substrate;

a supply layer stacked on the channel layer;
a first doped layer stacked on the supply layer;
a second doped layer stacked on the first doped layer; and
a third doped layer stacked on the second doped layer,
wherein a doping concentration of the first doped layer and a doping concentration of the third doped layer are lower than a doping concentration of the second doped layer, a gate is located on the third doped layer, and a source and a drain are electrically connected to the channel layer and the supply layer, respectively.

2. The p-GaN high-electron-mobility transistor as claimed in claim 1, wherein the doping concentration of the first doped layer and the doping concentration of the third doped layer are $1\times10^{16}$ to $1\times10^{18}$ atom/cm$^3$, and the doping concentration of the second doped layer is greater than $1\times10^{18}$ atom/cm$^3$.

3. The p-GaN high-electron-mobility transistor as claimed in claim 1, wherein the first doped layer and the third doped layer are a p-GaN layer, and the second doped layer is a p$^+$-GaN layer.

4. The p-GaN high-electron-mobility transistor as claimed in claim 1, wherein the first doped layer, the second doped layer and the third doped layer are formed by introducing a dopant during a deposition process, with the dopant being any one of alkaline earth metals.

\* \* \* \* \*